United States Patent
Cole et al.

(10) Patent No.: US 6,387,596 B2
(45) Date of Patent: *May 14, 2002

(54) METHOD OF FORMING RESIST IMAGES BY PERIODIC PATTERN REMOVAL

(75) Inventors: Daniel C. Cole, Jericho; Edward W. Conrad, Jeffersonville; David V. Horak, Essex Junction; Randy W. Mann, Jericho; Paul W. Pastel, Essex Junction; Jed H. Rankin, Burlington; Andrew J. Watts, Essex Junction, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/385,929

(22) Filed: Aug. 30, 1999

(51) Int. Cl.⁷ ................................................. G03F 7/20
(52) U.S. Cl. .......................... 430/311; 430/5; 430/312
(58) Field of Search .............................. 430/5, 312, 311

(56) References Cited

U.S. PATENT DOCUMENTS

| | | | | |
|---|---|---|---|---|
| 5,128,232 A | * | 7/1992 | Thackeray et al. | 430/192 |
| 5,234,791 A | * | 8/1993 | Dammel et al. | 430/270 |
| 5,385,804 A | * | 1/1995 | Premlatha et al. | 430/195 |
| 5,413,898 A | | 5/1995 | Kim et al. | 430/325 |
| 5,424,154 A | | 6/1995 | Borodovsky | 430/5 |
| 5,447,810 A | | 9/1995 | Chen et al. | 430/5 |
| 5,532,090 A | | 7/1996 | Borodovsky | 430/5 |
| 5,532,114 A | | 7/1996 | Bae | 430/312 |
| 5,573,890 A | * | 11/1996 | Spence | 430/311 |
| 5,807,649 A | | 9/1998 | Liebmann et al. | 430/5 |
| 6,074,801 A | * | 6/2000 | Iwasa et al. | 430/270.1 |
| 6,210,856 B1 | * | 4/2001 | Lin et al. | 430/270.1 |

OTHER PUBLICATIONS

Depth of Focus and Resolution Enhancement for i–line and deep UV lithography Using Annular Illumination, Partlo, W.N. et al., Proc. SPIE, vol. 1927, pt. 1, 1993, 137–157.*

* cited by examiner

*Primary Examiner*—Rosemary Ashton
(74) *Attorney, Agent, or Firm*—Scully, Scott, Murphy & Presser; William D. Sabo, Esq.

(57) ABSTRACT

The present invention provides a method of forming nested and isolated images in a photosensitive resist. In the disclosed method, the entire surface of the photosensitive resist or selected regions thereof is exposed to a first mask having a set of nested, i.e. repeating pattern or grid images thereon, and then exposed to a second mask in order to remove unwanted portions of the nested image, so as to provide regions of nested and regions of isolated images in said photosensitive resist. The method may also be used to form regions having images in proximity to one another and regions having isolated images by exposing the entire surface of the photosensitive resist to a first mask having repeating patterns, and then removing entire or portions of the repeating patterns by exposure of the photosensitive resist with a second mask.

20 Claims, 3 Drawing Sheets

METHOD OF FORMING RESIST IMAGES BY PERIODIC PATTERN REMOVAL

DESCRIPTION

Field of the Invention

The present invention relates to photolithography, and more specifically to a method of forming resist images by utilizing a grid mask containing a periodic set of images to produce a nested set of identical images over an entire chip surface or selected regions thereof and then removing any unwanted portions of said nested set of identical images with a trim mask.

BACKGROUND OF THE INVENTION

As the minimum feature size in semiconductor integrated circuit technology is pushed near or below the wavelength of light used in micro-lithographic projection printing, diffraction effects introduce significant differences between the patterns used on micro-lithographic reticles and the resulting printed structures on a semiconductor wafer. Similarly, the smaller the circuit elements become, the more difficult it is to create the desired pattern shapes on the wafer due to factors such as localized etch variations, mask distortions, lens distortions, topography variations, and non-uniform material composition.

These physical factors introduce deviations in isolated versus nested printed structures, with the degree of variation being highly dependent on the degree of proximity of nearby shapes. In order to maximize circuit performance and speed, it has been found highly desirable to make the device structure dimensions as identical as possible, e.g. to try to make isolated gates and nested gates print as identically as possible. These effects become increasing important as the physical dimensions of the circuit elements decrease.

Across Chip Linewidth Variation (ACLV) is one major problem in semiconductor device manufacturing. Image size variations can affect transistor speed matching and resistivity and conductance matching from one portion of the chip to another. One significant cause of printed pattern size variation is the diffraction component of imaging, which results in structures on a reticle being imaged differently depending upon what other structures are present in the local neighborhood.

A common form of this is differences between nested and isolated images. FIG. 1 shows a prior art mask intended to produce holes in a negative resist. FIG. 2 shows the resultant resist images with the isolated images being overexposed and smaller. In actuality, the printed shapes in FIG. 2 occur as rounded structures because each corner on a mask ends up as a printed rounded corner on the wafer. The isolated structure prints much differently than a nested structure. The degree that they print differently depends on the degree of proximity of nearby structures, as well as the size of nearby structures, the periodicity of nearby structures, and exposure tool illumination conditions.

It should be further appreciated that prior art photolithographic techniques require multiple custom masks to provide a nested and isolated image on the surface of a semiconductor wafer having improved ACLV. An example of such a technique, is described, for example, in U.S. Pat. No. 5,424,154 which discloses a method of enhancing the lithographic resolution of randomly laid out isolated structures, wherein a first mask comprising an active layer with isolated features such as gates is used. Portions of the active layer have a reduced dimension typical of periodic structures. The first mask disclosed in the '154 patent additionally has complementary features provided along side the reduced active features to provide periodicity. Accordingly, the resolution of the lithographic process is enhanced, and other enhanced resolution technologies additionally can be used to best advantage to form a patterned photosensitive layer having isolated features of reduced width. The photosensitive resist is then exposed to a second mask which exposes the complementary features so that they are removed from the latent image in the photosensitive resist. This second exposure reportedly improves resolution by enhancing contrast between exposed and unexposed regions.

While such prior art techniques can be used in printing resist images, it would be highly desirable to provide a method of forming resist images using a non-custom first mask (or a non-custom common grid mask useable for many designs) and a single custom trim mask to provide the nested and isolated images. This provides a significant reduction in manufacturing cost.

SUMMARY OF THE INVENTION

The present invention provides a method of overcoming the problems associated with prior art photolithographic techniques, especially those caused by ACLV, by first printing a set of nested images using a grid mask over the entire surface of a semiconductor chip or critical regions thereof; and then removing unwanted images with a trim mask. The grid mask can be fabricated and selected to be a nearly perfect mask for each chip size, so only the less critical trim mask is personalized for a given chip design.

Specifically, the method of the present invention comprises the steps of:

(a) exposing a photosensitive resist to a first mask having a grid pattern image thereon so as to form a repeating pattern image on said photosensitive resist; and (b) exposing the photosensitive resist containing said repeating pattern image to a trim mask having a predetermined pattern thereon so as to remove unwanted portions of the repeating pattern image in said photosensitive resist.

DETAILED DESCRIPTION OF THE INVENTION

Figure 1:
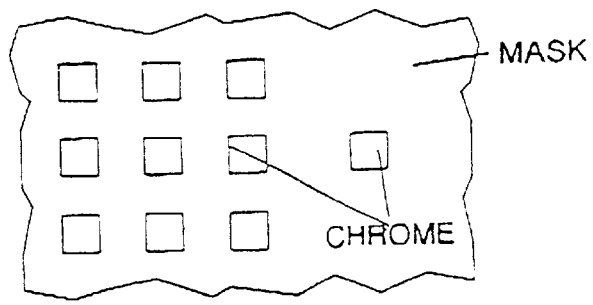
FIG. 1 represents a prior art mask used for forming holes in a negative resist layer.
Figure 2:
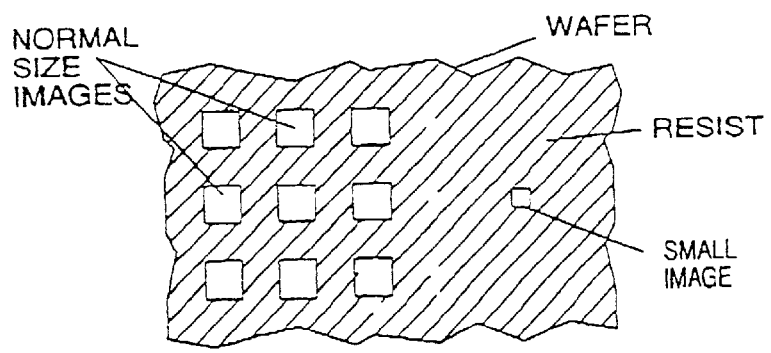
FIG. 2 shows the resultant resist image produced using the mask shown in FIG. 1.

The present invention, which provides a method of forming nested and isolated resist images by periodic pattern removal, will now be described in greater detail by referring to the drawings that accompany this application. It should be noted that in the drawings like and corresponding elements are referred to by like reference numerals.

Figure 3A:
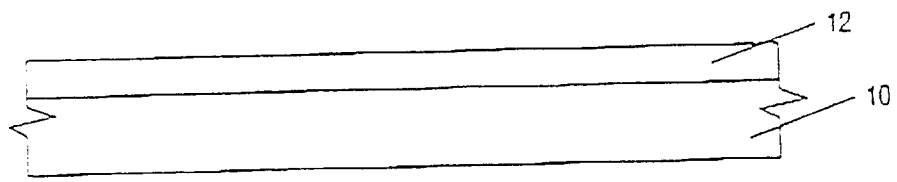
FIGS. 3A–G show the various processing steps and masks that are employed in the present invention in printing a nested and isolated resist image when a negative working resist is used.

Reference is made first to FIG. 3A which shows a structure comprising a substrate 10 having a layer of photosensitive resist 12 formed on the surface thereof.

Substrate 10 employed in the present invention is typically a semiconductor chip, wafer, interconnect structure, circuit board or other like semiconductor structures. The substrate is typically composed of, or contains, a semiconducting material such as Si, Ge, GaAs, InAs, InP or other like III/V compounds. The substrate may contain active device regions, wiring regions or other like regions. For clarity these regions are not shown in the drawings of the present application, but nevertheless, may be present therein.

Photosensitive resist 12 is composed of any conventional photosensitive material including dry resists and liquid resists which is capable of receiving an image during exposure. Examples of some suitable photosensitive resists that can be employed in the present invention include Shipley CGR2205 negative resist and Shipley UV5 positive resist as examples. Other negative or positive resists can also be employed in the present invention. Mixtures of negative and positive resists are also contemplated in the present invention.

The photosensitive resist is formed on the surface of substrate 10 using conventional deposition processes well known to those skilled in the art. Suitable deposition processes that can be employed in the present invention in forming photosensitive resist 12 on the surface of substrate 10 include: spin-on coating, dip coating, chemical vapor deposition, sputtering and other like deposition techniques.

Next, a suitable first mask having a desired grid image thereon is selected. The mask having the desired grid image (hereinafter "grid mask") comprises light blocking regions corresponding to features to be printed and open, light transmitting areas surrounding the features. Typically, the features of the grid mask comprise an opaque layer of, for example, chrome formed on a reticle base of quartz.

Figure 3B:
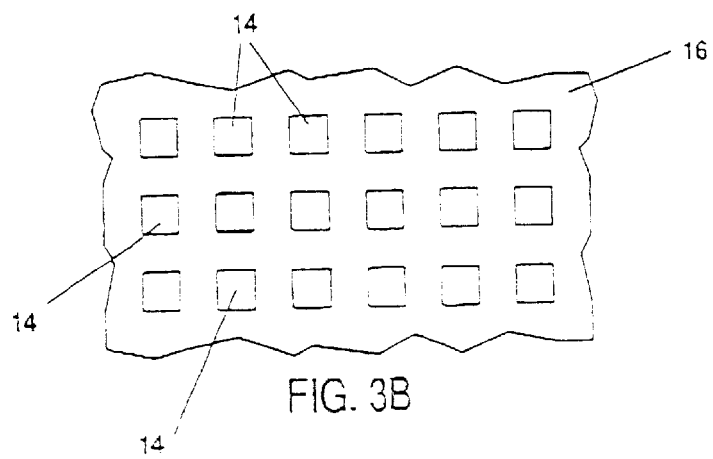

One such mask is shown in FIG. 3B, wherein reference numerals 14 are the feature regions composed of chrome and reference numeral 16 is the light transmitting area surrounding features 14. The grid mask of FIG. 3B would be used with a negative resist to form, for example, via images. The grid in FIG. 3B is shown as an array of square features 14. Feature 14 may be other shapes, and may even be comprised of combinations of two or more sub-features.

Figure 4:
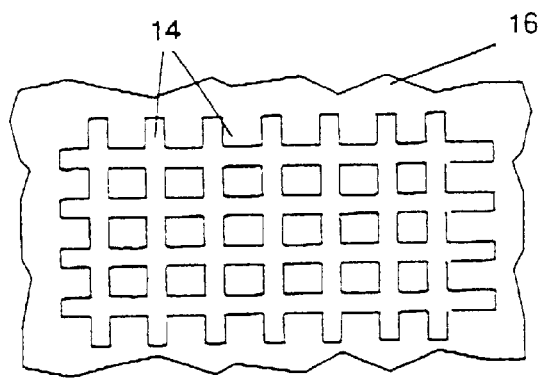
FIG. 4 shows a grid mask for fabricating lines when a positive working resist is used.

An alternative grid mask that can be employed in the present invention is shown in FIG. 4. In FIG. 4, feature 14 is a lattice. The grid mask of FIG. 4 would be used with a positive resist to form, for example, line images. It is noted that the grid mask employed in the present invention is one which is capable of forming nested images in the photosensitive resist during grid exposure.

The photosensitive resist is exposed to radiation through the grid mask structure using a commercially available exposure device to form a latent nested image of the grid mask in the photosensitive resist. Exposure conditions can be conventional circular illumination or off-axis illumination such as annular, dipole or quadrupole illumination. Exposure is typically carried in the present invention at an energy of from about 10 to about 30 millijoules/cm$^2$ using a 193 nm or 248 nm light source; i.e. laser, arc lamp and etc.

Figure 3C:
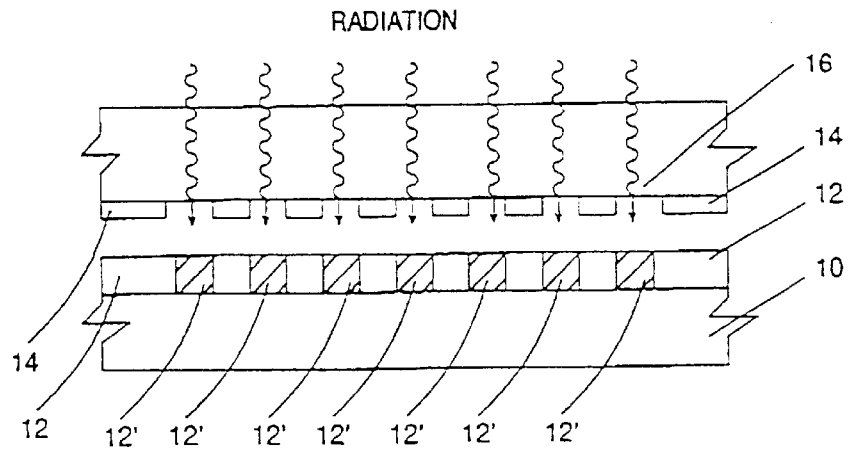

The above exposure process causes the formation of latent nested images 12' in photosensitive resist 12 that are harder than the adjacent areas which were not subjected to exposure. The structure containing the latent nested image on the photosensitive resist is shown in FIG. 3C.

Next, a trim mask is selected containing features of a desired pattern thereon so as to isolate certain regions of the nested image. The trim mask, like the grid mask disclosed, above, is composed of light blocking regions corresponding to features to be printed and open, light transmitting areas surrounding the features. Typically, the features comprise an opaque layer of, for example, chrome formed on a reticle base of quartz.

Figure 3D:
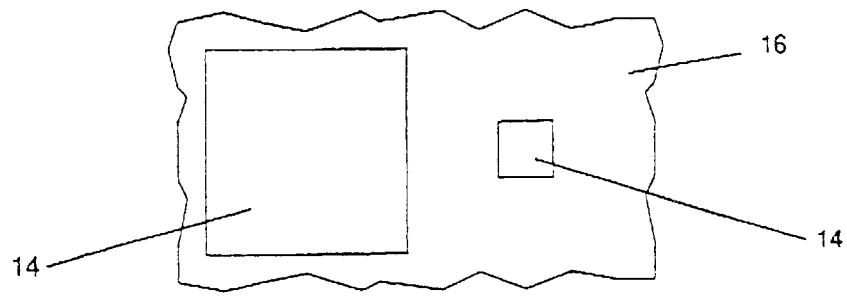
Figure 3E:
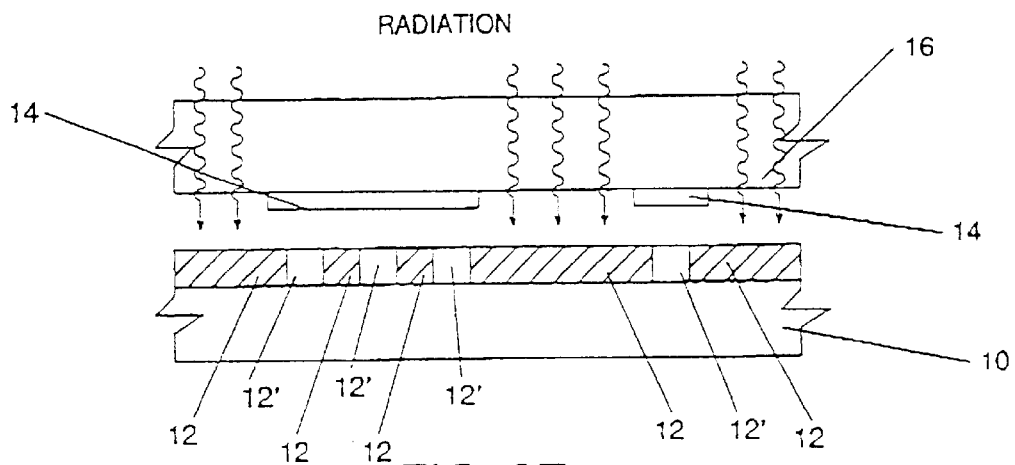

A typical trim mask that can be employed in the present invention is shown in FIG. 3D, wherein reference numerals 14 represent feature regions composed of chrome and reference numeral 16 represents light transmitting areas surrounding features 14. The trim mask of FIG. 3D would be used with a negative resist to form, for example, via images.

Figure 5:
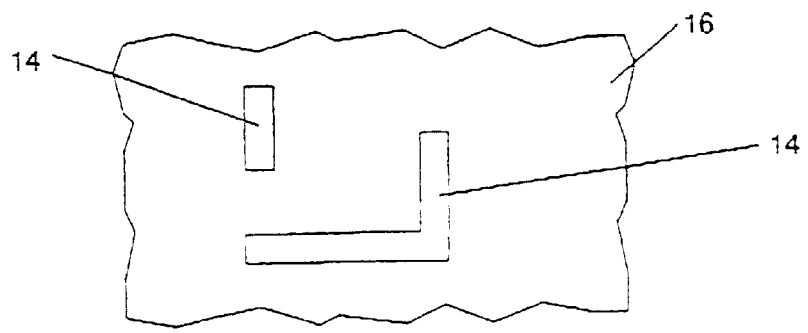
FIG. 5 shows the trim mask that is employed to remove unwanted portions of the grid provided using the grid mask shown in FIG. 4.
Figure 6:
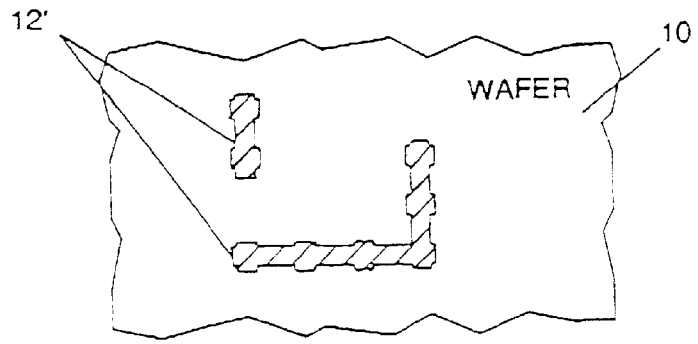
FIG. 6 shows the resultant nested and isolated resist image produced using the masks shown in FIGS. 4 and 5.

An alternative trim mask that can be employed in the present invention is shown in FIG. 5. The trim mask of FIG. 5 would be used with a positive resist to form, for example, line images. As is seen in those figures, the trim mask employed in the present invention has larger features than those of the grid mask, so as to be able to provide an isolated image on the surface of the photosensitive resist. However the exact relationship in size and overlay between the grid and trim masks may be adjusted based on the final image desired. For example, the trim mask of FIG. 5 may be adjusted to compensate for the intersections of the grid mask image in FIG. 4 so the resist images illustrated in FIG. 6 are uniform rather than variable in width along their lengths.

The photosensitive resist is exposed through the trim mask to radiation using a commercially available device using exposure conditions to modify the latent grid image in the photosensitive resist so as to remove unwanted portions of the nested latent image creating a latent isolated image in the photosensitive resist. Exposure conditions can be conventional circular illumination or off-axis illumination such as annular, dipole and quadrupole illumination. Exposure is typically carried in the present invention at an energy of from about 5 to about 30 millijoules/cm$^2$ using a 193 nm or 248 nm light source.

The trim mask exposure step also causes the formation of areas 12' on photosensitive resist layer 12 that are harder than the adjacent areas which were not subjected to exposure. The patterned structure may, if required, be subjected to additional trim exposure steps.

After trim exposure, the photosensitive resist may optionally be postbaked at a temperature of from about 70° to about 160° C. for a time period of from about 30 to about 120 seconds for Shipley CGR 2205 or at a temperature 6f from about 100° to about 160° C. for a time period of from about 30 to about 120 seconds for Shipley UV5. Other baking temperatures and times are also contemplated by the present invention.

Areas of photosensitive resist 12 that were not exposed in either grid or trim mask exposure steps are then developed, i.e. removed, using a suitable solvent that is capable of removing the non-exposed regions of the photosensitive resist, yet selective enough to leave behind the harden areas 12' containing the desired nested and isolated image pattern therein when the resist is a positive working resist. When the resist is a positive working resist, the developer is usually an aqueous basic solution capable of removing the exposed regions of the photosensitive layer, yet selective enough to leave behind the unexposed areas.

Figure 3F:
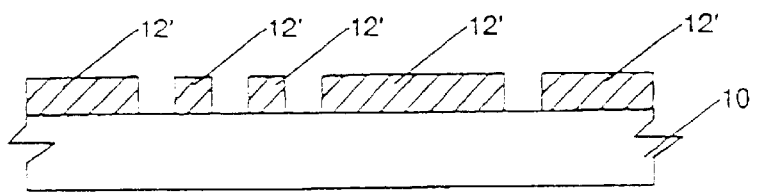
Figure 3G:
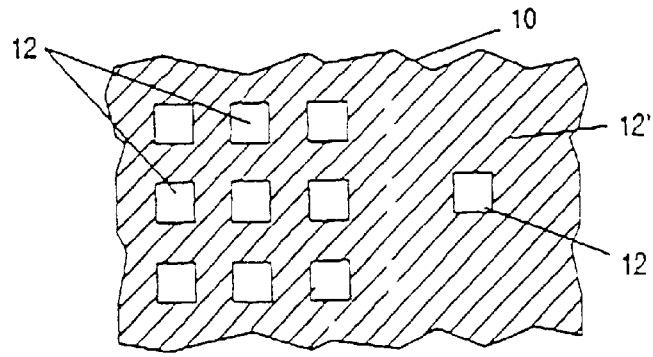

The final structure after exposing thru the trim mask and development is shown in FIGS. 3F and 3G for the case of a negative resist. FIG. 3F is a side view and FIG. 3G is a top view of a portion of the substrate containing the developed resist layer. Alternatively, FIG. 6 is a top view of a portion of the substrate containing the developed resist layer when a positive resist is used. As are shown therein, the substrate 10 contains a resist image 12' thereon which may have nested regions and isolated regions.

In some cases it may be useful to leave every other or every third or similar groupings of grid images. This can be achieved by exposing the photosensitive resist to the grid mask where the images are arranged in a first periodic pattern and then exposing the photosensitive resist to a trim mask having images arranged in a second periodic pattern. This results in unwanted portions of the grid mask images being removed in a third periodic pattern. The second and third periodicities are the same but different from the first periodicity.

It should be noted that by employing the method of the present invention it is possible to print images having nearly the same size as the masks utilized. Moreover, there are no gross image size differences using the method of the present invention. More specifically, some of the minor pattern dependent effects, such as those due to diffraction from the edge of the trim mask will still remain after employing the method of the present invention. These minor effects are, however, greatly offset by the fact that the present method removes the major contributor to proximity effects. In general, the trim mask has much larger dimensions than the dimension of the single structures so edge to edge proximity diffraction effects will be a much smaller contributor using the method of the present invention.

While the present invention has been particularly shown and described with respect to preferred embodiments thereof, it will be understood by those skilled in the art that the foregoing and other changes in form and detail may be made without departing from the scope and spirit of the invention.

Having thus described our invention in detail, what we claim as new and desire to secure by the Letters Patent is:

1. A method of forming resist images in a photosensitive resist comprising the steps of:
   (a) exposing a photosensitive resist to a first mask having a grid pattern image formed entirely thereon so as to form a repeating latent pattern image on said photosensitive resist; and
   (b) exposing the photosensitive resist containing said repeating latent pattern image to a trim mask having a predetermined pattern thereon so as to remove unwanted portions of the repeating latent pattern image on said photosensitive resist while leaving other portions of the repeating latent pattern image thereon thereby forming a desired feature on said photosensitive resist, said trim mask having larger features than said first mask.

2. The method of claim 1 wherein said photosensitive resist is formed on a substrate.

3. The method of claim 2 wherein said substrate is a semiconductor chip, wafer, interconnect structure or circuit board.

4. The method of claim 2 wherein said substrate is composed of, or contains, a semiconducting material selected from the group consisting of Si, Ge, GaAs, InAs, and InP.

5. The method of claim 1 wherein said photosensitive resist is a dry or liquid photosensitive material.

6. The method of claim 1 wherein said photosensitive resist is a radiation sensitive material selected from the group consisting of a negative working resist, a positive working resist and mixtures thereof.

7. The method of claim 1 wherein step (a) is carried out under conditions effective to provide harden areas in said photosensitive resist.

8. The method of claim 1 wherein step (a) is carried out using off-axis illumination.

9. The method of claim 8 wherein said off-axis illumination is annular.

10. The method of claim 1 wherein step (a) is carried out at an energy of from about 10 millijoules/$cm^2$ to about 30 millijoules/$cm^2$ using a 193 nm or 248 nm light source.

11. The method of claim 1 wherein said first mask comprises light blocking regions corresponding to features to be printed and open, light transmitting areas surrounding the features.

12. The method of claim 11 wherein said features comprise an opaque layer of chrome formed on quartz.

13. The method of claim 1 wherein step (b) is carried using off-axis illumination.

14. The method of claim 13 wherein said off-axis illumination is annular.

15. The method of claim 1 wherein said step (b) exposure is substantially less than said step (a) exposure.

16. The method of claim 1 further comprises a postbake step after step (b).

17. The method of claim 1 wherein said predetermined pattern is a repeating pattern.

18. The method of claim 1 wherein a portion of said predetermined pattern is a repeating pattern.

19. The method of claim 1 further comprising a development step after step (b) which removes unexposed areas of said photosensitive resist.

20. A method of forming resist images in a photosensitive resist comprising the steps of:
   (a) exposing a photosensitive resist to a first mask having a grid pattern image thereon so as to form a nested image on said photosensitive resist; and
   (b) exposing the photosensitive resist containing said nested image to a trim mask having a predetermined pattern thereon so as to remove unwanted portions of the nested image providing an isolated image in said photosensitive resist.

* * * * *